United States Patent [19]

Vinci et al.

[11] Patent Number: 5,312,562
[45] Date of Patent: May 17, 1994

[54] AQUEOUS ELECTRONIC CIRCUIT ASSEMBLY CLEANER AND METHOD

[75] Inventors: Alfredo Vinci, Dayton; M.Stephen Lajoie, Basking Ridge; Anthony E. Winston, East Brunswick, all of N.J.

[73] Assignee: Church & Dwight Co., Inc., Princeton, N.J.

[21] Appl. No.: 980,920

[22] Filed: Nov. 24, 1992

Related U.S. Application Data

[63] Continuation-in-part of Ser. No. 731,512, Jul. 17, 1991, abandoned.

[51] Int. Cl.$^5$ ............................................. C11D 3/10
[52] U.S. Cl. ............................. 252/174.14; 252/105
[58] Field of Search ........................ 252/105, 174.14

[56] References Cited

U.S. PATENT DOCUMENTS

| | | |
|---|---|---|
| 2,739,129 | 3/1956 | Manchot ............... 252/174.14 X |
| 3,672,993 | 6/1972 | Mitchell et al. ........... 252/174.14 X |
| 4,347,152 | 8/1982 | Wixon .................. 252/174.14 X |
| 4,348,292 | 9/1982 | Ginn ..................... 252/174.14 X |
| 4,434,069 | 2/1984 | Fairchild ................ 252/174.14 X |
| 4,783,281 | 11/1988 | Bishop et al. ........... 252/174.14 X |
| 4,844,744 | 7/1989 | Leiter et al. ............. 252/174.14 X |
| 5,015,408 | 5/1991 | Reuss ................... 252/174.14 X |

*Primary Examiner*—Patrick P. Garvin
*Attorney, Agent, or Firm*—Charles B. Barris

[57] ABSTRACT

The present invention relates to environmentally safe aqueous saponifier compositions for cleaning electronic circuit assemblies, such as printed circuit or printed wiring boards, during their fabrication. Alkali metal carbonate and bicarbonate salts are utilized preferably with various adjuvants, such as an antifoam agent or surfactant to achieve a variety of objectives, among which are the removal of solder flux, oils, waxes, and greasy substances and adhesive and other residues.

10 Claims, 4 Drawing Sheets

AQUEOUS ELECTRONIC CIRCUIT ASSEMBLY CLEANER AND METHOD

RELATED APPLICATION

This application is a Continuation-in-part of U.S. Ser. No. 731,512, filed Jul. 17, 1991, now abandoned.

FIELD OF THE INVENTION

The present invention relates to environmentally safe aqueous saponifier compositions for cleaning electronic circuit assemblies, such as printed circuit or printed wiring boards, during their fabrication. Alkali metal carbonate and bicarbonate salts are utilized preferably with various adjuvants, such as a reducing agent or antifoam agent, to achieve a variety of objectives, among which are the removal of solder flux, oils, waxes and greasy substances and adhesive and other residues.

BACKGROUND OF THE INVENTION

The cleanliness of electronic circuit assemblies (ECA), such as printed circuit boards (PCB) or printed wiring boards (PWB), is generally regarded as being critical to their functional reliability. Ionic and nonionic contamination on circuit assemblies is believed to contribute to premature failures of the circuit assemblies by allowing short circuits to develop.

In the manufacture of electronic circuit assemblies, ionic and nonionic contamination can accumulate after one or more steps of the process. Circuit assembly materials are plated, etched, handled by operators in assembly, coated with corrosive or potentially corrosive fluxes and finally soldered.

In the fabrication of electronic circuit assemblies, e.g. printed circuit boards soldering fluxes are first applied to the substrate board material to ensure firm, uniform bonding of the solder. These soldering fluxes fall into two broad categories: rosin and non-rosin, or water soluble, fluxes. The rosin fluxes, which are generally non-corrosive and have a much longer history of use, are still widely used throughout the electronics industry. The water soluble fluxes, which are a more recent development, are being used increasingly in consumer products applications. Because they contain strong acids and/or amine hydrohalides and are thus corrosive, the water soluble soldering fluxes can cause circuit failure if residual traces of the material are not carefully removed. For that reason military specifications require the use of rosin fluxes.

Even the use of rosin soldering fluxes, however, can lead to premature circuit failure due to decreased board resistance if traces of residual flux are not removed following soldering. While water soluble fluxes can be easily removed with warm, soapy water, the removal of rosin flux from printed circuit boards has traditionally been carried out with the use of chlorinated hydrocarbon solvents such as 1,1,1,-trichlorethane, trichloromonofluoromethane, methylene chloride, trichlorotrifluoroethane, or mixtures or azeotropes of these solvents. These solvents are undesirable, however, because they are toxic. Thus, their use is subject to close scrutiny by the Occupational Safety and Health Administration (OSHA), and stringent containment equipment must be used. Moreover, if released into the environment these solvents are not readily biodegradable and are thus hazardous for long periods of time.

Alkaline cleaning compounds known as the alkanolamines, usually in the form of monoethanolamine, have been used for rosin flux removal as an alternative to the toxic chlorinated hydrocarbon solvents. These high pH compounds (e.g., about 12 pH), chemically react with rosin flux to form a rosin soap through the process of saponification. Other organic substances such as surfactants or alcohol derivatives may be added to these alkaline cleaning compounds to facilitate the removal of such rosin soap. Unfortunately, these compounds, as the water soluble soldering fluxes, have a tendency to cause corrosion on the surfaces and interfaces of printed wiring boards if they are not completely and rapidly removed during the fabrication process.

In other approaches, Daley et al., U.S. Pat. No. 4,635,666 utilize a highly caustic solution having a pH of 13 in a batch cleaning process. This method severely oxidizes the solder applied to the circuit board. In Hayes et al., U.S. Pat. Nos. 4,640,719 and 4,740,247 rosin soldering flux and other residues are removed from electronic assemblies by means of terpene compounds in combination with terpene emulsifying surfactants by rinsing in water.

The complete removal of adhesive and other residues also poses a problem. During the manufacture of electronic circuit assemblies the components are mounted on the upper surface of the board with leads protruding downwardly through holes in the board and are secured to the bottom surface of the board by means of an adhesive. Further, it is sometimes necessary to temporarily protect certain portions of the board from processing steps such as the process of creating corrosion resistant gold connecting tabs at the board edges. This transient protection of portions of the circuit board can be achieved by the application of special adhesive tape to susceptible areas. Once such protection is no longer needed, the adhesive tape must be removed. In both instances, a residue of adhesive generally remains which, if not thoroughly removed, can cause premature board failure. Removal of this adhesive residue has traditionally been carried out by the use of chlorinated solvents which, as already described, are toxic and environmentally undesirable.

Thus, the residual contaminants which are likely to be found on electronic circuit assemblies and which can be removed by the compositions and method of the present invention include, but are not limited to, for example, rosin flux, photoresist, solder masks, adhesives, machine oils, greases, silicones, lanolin, mold release, polyglycols and plasticizers.

SUMMARY OF THE INVENTION

It is an object of the present invention to provide compositions and methods for the safe and effective removal of rosin soldering fluxes from electronic circuit assemblies, e.g., printed circuit boards, without otherwise adversely affecting the boards. It is a further objective of this invention to provide safe and effective compositions and methods for the removal of other residual contaminants from printed circuit assemblies.

This invention provides cleaning compositions and methods for the removal of rosin solder fluxes and other residues during the fabrication of printed circuit or wiring boards. As a result, the possibility of premature circuit failure that might occur in the absence of such cleaning is eliminated or greatly reduced. The cleaning efficacy of the compositions of the invention is such that printed wiring boards thus treated meet stringent U.S. Department of Defense specifications.

The compositions of the invention are characterized by non-corrosiveness and low environmental impact, unlike the chlorinated hydrocarbon solvents and alkaline cleaners that have heretofore been employed for printed wiring board and printed circuit board cleaning. Advantageously, the saponifier compositions, as used herein, exhibit biological oxygen demands (BOD) and chemical oxygen demands (COD) well below the limits promulgated by various governmental environmental agencies For example, BODs considerably below 200 ppm, e.g., 35 and CODs considerably below 1000 ppm, e.g., 71 ppm are regularly attained. As a result, the need for costly containment equipment is eliminated. Further, the problem of costly waste treatment, e.g., processing and disposal steps, is not encountered.

The present invention provides printed circuit/wiring board cleaning compositions comprising alkali metal carbonate and bicarbonate saponifier salts so combined that they have, when used in concentrations of about 1 to 15 percent by weight, a pH of from about 10, or less, to 12 and an adequate reserve of titratable alkalinity, at least equivalent to from about 0.3 to 4.5 percent caustic potash (potassium hydroxide), when titrated to the colorless phenolphthalein end point, which is about pH 8.4. At least about 50 percent and, preferably, at least about 65 percent by weight of the carbonate salts comprise potassium carbonate. The aqueous saponifier solutions generally contain from about 1 to 15 percent or even more depending on the particular conditions and, preferably, from about 2 to 8 percent by weight of the salts comprising the saponifier composition. In addition, the saponifier solutions usually contain a small amount, e.g., from about 50 to 5000 ppm of a water soluble reducing agent (oxygen scavenger). Preferably, the saponifier solutions also contain at use a small amount, e.g., up to about 0.1 percent by weight of an antifoam agent. These, as well as other adjuvants, e.g., wetting agents, surfactants, etc., can be included with the salts per se or in any solution thereof no matter what the concentration of salts therein. When used according to the above, the compositions do not leave an undesirable residual film.

BRIEF DESCRIPTION OF THE FIGURES

The efficacy of this invention will be better understood by reference to FIGS. 1-7 herein wherein the test results of certain embodiments of the saponifiers of this invention are illustrated.

DETAILED DESCRIPTION OF THE INVENTION

Figure 1:
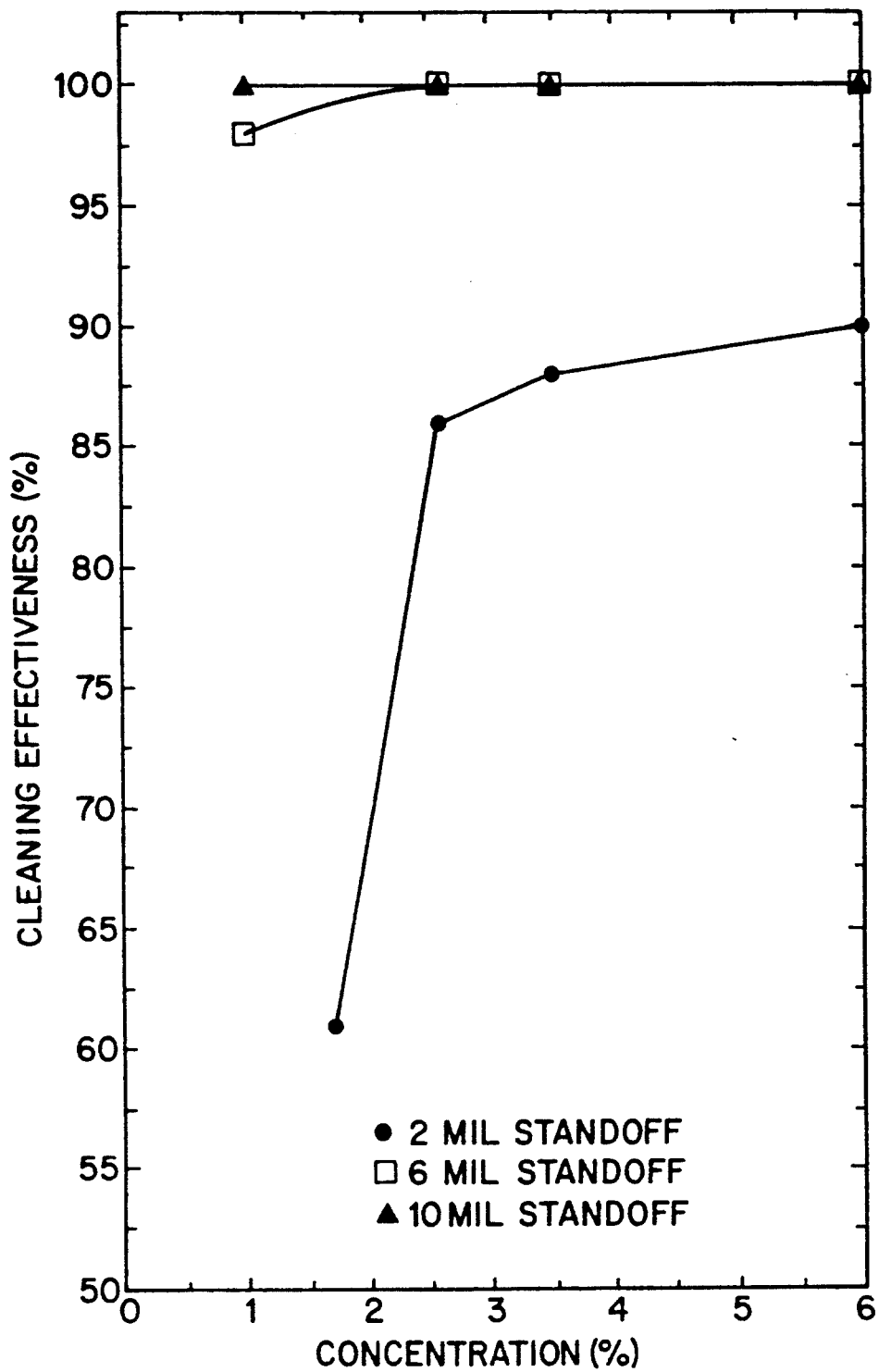
FIGS. 1, 2, 4, and 6 represent typical curves showing the cleaning efficiencies of various concentrations of saponifier solutions resulting from visual testing as described herein.

The objects and advantages mentioned above as well as other objects and advantages may be achieved by the compositions and methods hereinafter described.

Essentially, the saponifier compositions of the invention are substantially water soluble and comprise mixtures of certain alkali metal salts. Accordingly, the term "saponifier compositions" as used herein is intended to define the mixture of essentially dry ingredients comprised of the alkali metal salts and, if desired, any added adjuvants as hereinlater described.

As hereinlater set forth, the saponifier compositions may be diluted into concentrated solutions. The terms "saponifier concentrated solutions" or "concentrates" as used herein define aqueous mixtures containing from about 10 to 45 or more percent by weight of the dry saponifier compositions with the balance being essentially water.

As used herein the terms "saponifier solutions" or "saponifier solutions in use" is meant to define aqueous mixtures of from about 1 to 15 percent by weight of the dry saponifier composition with the balance comprised essentially of water which are employed in the cleaning methods of the invention. Preferably deionized water is used for both the saponifier concentrates and saponifier solutions.

In accordance with the invention, additives, adjuvants, or the like, may be included with the saponifier compositions, saponifier concentrates, or the saponifier solutions in use. Such additives, adjuvants, and the like should be water soluble or at least readily water dispensible.

The saponifier compositions of the present invention contain mixtures of alkali metal salts, i.e., mixtures of carbonates and bicarbonates. The alkali metals contemplated include potassium, sodium and lithium, with potassium being preferred. The carbonate salts include potassium carbonate, potassium carbonate dihydrate, and potassium carbonate trihydrate, sodium carbonate, sodium carbonate decahydrate, sodium carbonate heptahydrate, sodium carbonate monohydrate, sodium sesquicarbonate and the double salts and mixtures thereof. The bicarbonate salts include potassium bicarbonate, sodium bicarbonate, lithium bicarbonate and mixtures thereof. Generally, the saponifier compositions of the invention will contain the carbonate salts in amounts of from about 70 to 95 percent, preferably, about 82.5 to 92.5 percent, for example, about 87.5 percent by weight. The carbonate salts comprise at least about 50 percent, preferably at least about 65 percent, for example, about 75 percent by weight of potassium carbonate. The bicarbonate salts in amounts of about 5 to 30 percent, preferably, about 10.0 to 20.0 percent, for example, about 12.5 percent by weight, based on the total amount of the carbonate and bicarbonate salts utilized. As set forth above, the alkali metal carbonate and bicarbonate salts are utilized in combinations and in concentrations such that the resultant solutions have a pH of from about 10, or somewhat less, to 12 and also an adequate reserve of titratable alkalinity, as least equivalent to from about 0.3 to 4.5%, preferably from about 0.6 to 4.5%, caustic potash (potassium hydroxide), when titrated to the colorless phenolphthalein end point, which is at about pH 8.4.

The saponifier compositions of the present invention which are comprised of carbonate and bicarbonate salts as set forth above are generally prepared as aqueous concentrates. Such aqueous saponifier concentrates may contain from about 10 up to about 45, or more, percent by weight of the salts depending on their solubility in water. Preferably, the concentrates contain about 15 to 40 percent by weight of the saponifier composition (i.e., carbonate and bicarbonate salts) with the remainder essentially water. The dilutions of these concentrates are determined by manufacturing, packaging, shipping, storage, and other factors. It should be understood that the amount of solute in these concentrates is not especially critical.

The saponifier solutions which are employed in the cleaning procedures described herein usually contain from about 1 to 15, or more, percent and, preferably, from about 1.7 to 8 percent by weight of the saponifier compositions of this invention with the balance being essentially water. The upper limit of concentration of the saponifier composition is not critical and is determined by fabrication conditions, the amount of residues and the difficulty of removing same from the circuit assemblies, etc. The adjuvants, additives, and the like which may be also employed are used in such small amounts relative to the other components that they need not be included when defining the weight percentages of the saponifier concentrates or the saponifier solutions as described and used herein.

In accordance with the invention, at least one water-soluble reducing agent and/or antioxidant is preferably employed. The reducing agents include, alone or in combination, sodium bisulfite and hydrazine hydrate, which are the preferred reducing agents, the aminoboranes, e.g., dimethylamine borane, the alkali-metal borohydrides, e.g., potassium borohydride, the alkali-metal hydrophosphites and hydrosulfites, e.g., sodium hydrosulfite, and formalin. Other preferred reducing agents include dihydrazine sulfate and other salts thereof.

The reducing agent employed may also be an hydroxylamide, or an hydroxylamine addition salt, e.g., hydroxylamine sulfate, hydroxylamine hydrochloride, hydroxylamine nitrate, hydroxylamine acetate, hydroxylamine formate, hydroxylamine bromide, and the like, and mixtures thereof. Other salts such as potassium pyrosulfate, sodium hypophosphite, sodium and potassium sulfite, sodium bisulfite, sodium metabisulfite, sodium dithionite, sodium formaldehyde sulfoxylate, zinc formaldehyde sulfoxylate, sodium nitrite, and mixtures thereof can also be used.

The water soluble reducing agent is supplied in an amount which is sufficient to substantially, if not completely, preclude the oxidation of solder to its "dull" state and maintain it in its "shiny" state which is deemed important to assess the adequacy of the soldered joints or connections. The concentration of the reducing agent with the saponifier should be an effective amount which will generally range from about 50 to 5000 ppm, preferably, about 100 to 1000 ppm, of the total aqueous saponifier solution in use. Amounts included in the saponifier compositions and concentrates can be calculated accordingly.

The antioxidants which maybe employed in accordance with the invention include butylated hydroxyanisole (BHA), butylated hydroxytoluene (BHT), terbutyl hydroquinone (TBHQ), the tocopherols, and the like. Generally the antioxidants are employed in amounts such that the saponifier solution contains from about 10 to 1000 ppm and, preferably, from about 50 to 500 ppm, of the aqueous saponifier solution in use.

At least one antifoam agent may be, and preferably is, included in any of the saponifier products of this invention. The antifoam agent is utilized to alter the surface tension caused by the rosin flux/saponifier combination and prevent foam or detrimental residual "film" from being formed. Desirably, the agent will produce a surface film on the component that has a substantially constant surface tension when subjected to expansion or contraction. The foam inhibitors herein must do this by swamping the surface with nonfoaming, rapidly diffusing, non-cohesive, only moderately surface-active molecules, so that any transient rise in surface tension caused by film expansion is rapidly negated. It is important, if not critical, that the antifoam agent used herein does not act by replacing the flux/saponifier film with another residual surface film, e.g., with a film of soap molecules that form a "solid," brittle film.

Preferred examples of antifoam agents include compounds formed by condensing ethylene oxide with a hydrophobic base formed by the condensation of propylene oxide with propylene glycol. The hydrophobic portion of the molecule which exhibits water insolubility has a molecular weight of from about 1,500 to 1,800. The addition of polyoxyethylene radicals to this hydrophobic portion tends to increase the water solubility of the molecule as a whole and the liquid character of the product is retained up to the point where polyoxyethylene content is about 50 percent of the total weight of the condensation product. Examples of such compositions are the "Pluronics" sold by BASF-Wyandotte.

Other suitable antifoam agents include: the polyethylene oxide condensates of alkyl phenols, e.g., the condensation products of alkyl phenols having an alkyl group containing from about 6 to 12 carbon atoms in either a straight chain or branched chain configuration, with ethylene oxide, the said ethylene oxide being present in amounts equal to 10 to 25 moles of ethylene oxide per mole of alkyl phenol. The alkyl substituent in such compounds may be derived from polymerized propylene, diisobutylene, octene, or nonene, for example.

Also suitable are those derived from the condensation of ethylene oxide with the product resulting from the reaction of propylene oxide and ethylene-diamine or from the product of the reaction of a fatty acid with sugar, starch or cellulose. For example, compounds containing from about 40 percent to about 80 percent polyoxyethylene by weight and having a molecular weight of from about 5,000 to about 11,000 resulting from the reaction of ethylene oxide groups with a hydrophobic base constituted of the reaction product of ethylene diamine and excess propylene oxide, and hydrophobic bases having a molecular weight of the order of 2,500 to 3,000 are satisfactory.

In addition, the condensation product of aliphatic alcohols having from 8 to 18 carbon atoms, in either straight chain or branched chain configuration, with ethylene oxide, e.g., a coconut alcohol-ethylene oxide condensate having from 10 to 30 moles of ethylene oxide per mole of coconut alcohol, the coconut alcohol fraction having from 10 to 14 carbon atoms, may also be employed.

The antifoam agents of the present invention are preferably employed in the saponifier solution in amounts of up to about 0.1 percent by weight, preferably, about 0.01 to 0.05 percent by weight based on the total weight of the aqueous saponifier solution. The antifoam agents can also be included in the dry saponifier compositions as well as the saponifier concentrates so as to result in the desired concentrations at use.

The present invention also contemplates the use of one or more surfactants in the saponifier solutions in order to enhance the wetting ability of the saponifier and permit maximum penetration thereof within regions of the circuit boards most difficult to clean. Suitable wetting agents include anionic, nonionic and cationic surfactants (or combinations thereof such as amphoteric surfactants). The surfactants should be soluble, stable and, preferably, nonfoaming in use. Inasmuch as the solutions herein are alkaline, it is preferred to employ an anionic or nonionic surfactant. Combination of surfactants may be employed. The term "surfactant", as used herein, may include other forms of dispersing agents or aids. The amounts of surfactant utilized is usually minute, i.e., less than 1000 ppm, but will vary depending on the conditions and the contamination encountered.

The compositions of this invention are preferably free of chelating or complexing agents such as high molecular weight acrylic polymers. If the preferred deionized water is utilized for the saponifier concentrates or solutions, such chelating and complexing agents are not required. Importantly, since some of the solder joints for the printed circuit boards contain metals such as lead, tin and copper, the absence of a chelating agent minimizes the solubility of such metals in the saponifier solutions during use which could cause environmental problems during disposal of the solutions subsequent to use.

The compositions of this invention are characterized by extremely low environmental impact, unlike the chlorinated hydrocarbon solvents and other materials that had been used prior to this invention for printed circuit board cleaning. The alkali metal carbonate and bicarbonate salts are naturally occurring and environmentally benign. The saponifier compositions of the invention have biological oxygen demand (BOD) and chemical oxygen demand (COD) values (as determined by methods hereinafter described more fully) which are well below the acceptable limits promulgated by various environmental agencies. As described in the Examples herein, the saponifier compositions, even after use, i.e., containing the fabrication residues and contaminates, exhibited BODs of about 35 and CODs of about 71. In comparison, terpenes, e.g., limonene, are reported as having BODs of about 295 and CODs of about 1,425, (see Hayes et al, U.S. Pat. Nos. 4,640,719 and 4,740,247).

The applicability of the compositions of the invention to various aspects of the printed circuit/wiring board fabrication process can best be understood by a description of a representative assembly process.

The assembly manufacturing process involves the placement of components such as integrated circuits, resistors, capacitors, diodes, etc. on the surface of the board or their insertion through pre-drilled holes. The components are then secured by soldering by mechanical or automatic means. Interspersed with the soldering operations are cleaning procedures and inspections to ensure that tape and solder flux residues than could lead to premature circuit failure do not remain.

For the removal of rosin soldering flux deposits and other residues during printed circuit/wiring board fabrication, the compositions of the invention may be applied to the boards by immersion in dip tanks or by hand or mechanical brushing. Alternatively, they may be applied by any of the commercially available printed wiring board cleaning equipment. Dishwasher size units may be employed, or much larger cleaning systems such as the "Poly-Clean +" and the various "Hydro-Station" models produced by Hollis Automation, Inc. of Nashua, N.H.

Depending upon their design, these washers may apply the saponifier compositions of the invention by spraying with mechanical nozzles or by rolling contact with wetted roller surfaces. The temperature at which the compositions may be applied can range from room, or ambient, temperature (about 70° F.) to about 180° F., preferably, about 150° to 160° F. The saponifier compositions or concentrates are diluted with water to as low as about 1.0 percent by weight (or volume) concentration.

Once solder flux has been loosened and saponified during a period of contact which typically ranges from about 1 to about 5 minutes, the solutions of the invention are removed. Another advantage of the instant invention is that the saponifying solutions need not be flushed with solvents as with the processes of the prior art. Herein, the boards may simply be flushed with water for a period of up to about 2 minutes. Deionized water is preferred. The optimal rinsing time varies according to the kinds of surfactants and the concentrations of the saponifier solutions used and can easily be determined by routine experimentation.

The cleaned boards are then dried, preferably with forced air. Drying is expedited if the air is warmed, preferably to above about 100° F.

The efficacy of rosin soldering flux removal from printed wiring boards is such that the boards meet stringent military specifications for low resistivity after cleaning. For example, the boards meet the Mil-P-28809A standard for low resistivity of the solvent extracts resulting when the contamination has been removed from a circuit board cleaned according to Mil-P-55110C. The resistivity of such solvent extracts after the cleaning of the boards is complete is most easily determined with an Omega Meter. Omega Meter is the registered trademark of Kenco Industries, Inc., Atlanta, Ga., for a microprocessor-controlled contamination test system that rapidly measures changes in resistivity due to contaminating ions.

The results of Omega Meter measurements are expressed in equivalent units of ug $NaCl/in^2$ or its metric equivalent. According to MIL-P-28809A, the acceptable resistivity value for a cleaned board is equivalent to 2.2. ug $NaCl/cm^2$ or 14 ug $NaCl/in^2$, but far better results are routinely obtained after solder flux has been removed with the saponifier solutions of the present invention. A value of about 0.31 ug $NaCl/cm^2$, or 2.0 ug $NaCl/in^2$, or even less, is typical.

The saponifier solutions of this invention are also effective in removing other undesirable and deleterious substances and residues. One particularly troublesome substance is the residue left by adhesive tape used during fabrication of the electronic circuit assemblies.

During the process of gold plating connecting tabs to improve corrosion resistance, tin-lead residues must first be removed from the unplated tabs. Removal of these residues is carried out through the use of etching chemicals that can damage other unprotected printed circuit/wiring board components. To protect vulnerable components from the etching chemicals, boards are wrapped on both sides with an adhesive plating tape which forms a shield or splash guard for all but the exposed tab area. The etching chemicals then remove the tin-lead residues on the tabs, a nickel plate is applied as a base for the gold, and gold plating of the tabs is finally carried out. The adhesive plating tape which is maintained in place through all of these etching and plating steps, is then removed. When the tape is removed following the nickel and gold plate step, it is at this point that the saponifier compositions of the invention may most advantageously be used.

Thus, following removal of the tape, a silicone-based and/or rubber-based adhesive residue may remain on the board. This residue may easily be removed by employing the compositions of the invention under the same conditions described above for solder flux removal. The exact operational parameters will be determined by the nature of the adhesive residue and the tenacity with which it adheres to the board, but the conditions described above are generally effective. As in the case of solder flux removal, treatment of the board with the saponifier solutions of the invention is generally followed by water flushing and air drying.

The efficiency of removal of adhesive residues from printed circuit/wiring boards by the compositions of the invention is such that no residues are visible after cleaning. A simple 5-10X stereomicroscope can facilitate visual inspection for tape residues following cleaning.

The following non-limiting Examples are provided to further illustrate the present invention. All percentages, unless otherwise noted, are by weight. However, due to the near equivalence of the weight and volume of the materials utilized, volume percent is essentially the same.

EXAMPLES I-IV

To illustrate the cleaning ability of the saponifier compositions of the invention, a series of demonstration printed wiring boards were cleaned in a mechanical cleaning system.

The cleaning composition contained, by weight, 75 percent potassium carbonate, 12.5 percent sodium bicarbonate, and 12.5 percent sodium carbonate monohydrate. Saponifier solutions having various concentrations were prepared.

The cleaning system was a "Poly-Clean +" machine which is manufactured by Hollis Automation, Inc. of Nashua, N.H.

The cleaning sequence comprised the operations of loading, washing, drying, first rinsing, final rinsing and high speed drying carried out in succession. The washing operation utilizing saponifier solutions of the invention was done in two stages, i.e., a first regular wash at spray nozzle manifold which directed a regular wash spray at 40 psig followed by a "hurricane" spray at 80 psig. The cleaning solutions were maintained at 160° F. The rinses were also two stage operations; the first at 40 psig regular rinse followed by an 80 psig "hurricane" rinse with the rinse water having a temperature of 160° F. A final rinse was effected under substantially the same conditions. The circuit boards were subjected to Alpha air knife drying after the washing and final rinse stages. In air knife drying, turbine propelled air shears fluids from the boards' surfaces.

Cleaned and dried boards were evaluated for cleaning efficiency both visually and by an Alpha 600 5MD Omega Meter resistivity measurements.

The visual test method uses a dyed flux and carrier base injected between glass components and a glass board. This provides excellent access for visual inspection. The analysis is further quantified by placing the board and components against a grid. Each block of the grid is then read as being completely clean or containing residue.

The test method utilizes straight flux and carrier from a rosin mildly activated (RMA) flux or paste. It is essentially the solder paste minus the solder. "Carrier" refers to both the flux paste and all other additives included in solder paste, except the solder. This carrier is then injected with red dye so that visual examination can be made more rapidly. The dye does not affect the carrier density or melting properties. The dyed carrier is then injected under the glass components on specially made test boards. RMA solder paste is not considered an aqueous-compatible flux. The test boards are constructed of glass. A 1"×1" square coupon that simulates the component is mounted onto a glass substrate. The coupon is glued in place by first laying shim stock of the desired standoff height on the glass. Next, the glue is applied and the coupon set in place until it dries. When dry, the shim stock is removed. Six coupons are mounted on a single board at ⅛" spacing. The interior coupons are further shielded from any nozzles by the first coupons in the placement array.

The flux carrier stock is injected under each coupon to entirely fill the inch-square area. Flux is also added to the area surrounding each coupon. The board is IR-reflowed at a typical dwell time of five minutes at reflow temperature. All boards are then stored for 24 hours at ambient temperature prior to cleaning. Reflowing and storing increases cleaning difficulty by allowing the board to cool and the flux carrier to set up.

Prior to reflow, the entire area under the coupon is filled with the dyed flux carrier. During reflow, a small percentage of the area under the coupon develops voids due to expansion and escape of flux volatiles. The area under the coupons filled with baked-on residue is measured prior to cleaning. The application method causes most of the flux to be bridged across the component standoff height. These regions entirely filled with flux are the most difficult to clean. They are also much less likely to occur in actual manufacturing processes since much less flux is applied. For the purposes of this test, however, no special measurement qualification is given to this category. By regarding all areas with flux trapped under them as the same, the test method is made more rigorous. This method is directed toward the measurement of cleaning effectiveness, which is defined as the percentage of residue removed. This aqueous cleaning test method is described more fully in a publication by Janet R. Sterritt, "Aqueous Cleaning Power," *Printed Circuit Assembly*, September 1989, pp. 26-29.

The results from the cleaning experiments are measured in terms of cleaning effectiveness as follows. The area of reflowed flux carrier is measured prior to cleaning. The test board is then cleaned and the amount of flux residue is visually measured with the aid of a grid pattern. The cleaning effectiveness rating is established by dividing the area still containing flux after cleaning by the total area containing flux prior to cleaning. The measurement technique shows that a completely clean board would result in a cleaning effectiveness rating of 100%. A test board on which three quarters of the initial residue is removed would show a 75% reading.

To make the resistivity measurements, cleaned and dried boards were loaded into a test cell of the instrument and then extracted with a circulating solution of isopropanol:water (25:75), v/v as specified by MIL-P-55110C and MIL-P-28809A. The resistivity of the solution was measured at a rate of 24 times per minute over a period of about 5-15 minutes until equilibrium was reached, indicating that extraction of board surface contamination was essentially complete. Equilibrium was defined as the point at which the change in measured resistivity of the solution was less than or equal to 5% of any value measured in the previous two minutes.

EXAMPLE I

In this example, demonstration glass printed wiring boards (as developed by Hollis Automation to evaluate cleaning solution and as hereinbefore described more fully) which were reflowed with Alpha flux paste as disclosed above were subjected to the sequence of cleaning operations also disclosed above. Five different concentrations of saponifier cleaning solutions, i.e., concentrations of 1.0, 1.7, 2.6, 3.5 and 6.0 percent were employed. Three different standoff distances were employed, viz., 2 mils, 6 mils, and 10 mils, respectively.

The results are shown in FIG. 1 in terms of cleaning effectiveness. These results clearly demonstrate the efficacy of the saponifier solutions of the present invention, especially at concentrations of 2.0 percent and above. The efficacy of the saponifier solutions at standoffs as low as 2 mils is especially noteworthy because of the difficulty in accessing the flux.

EXAMPLE II

Figure 2:
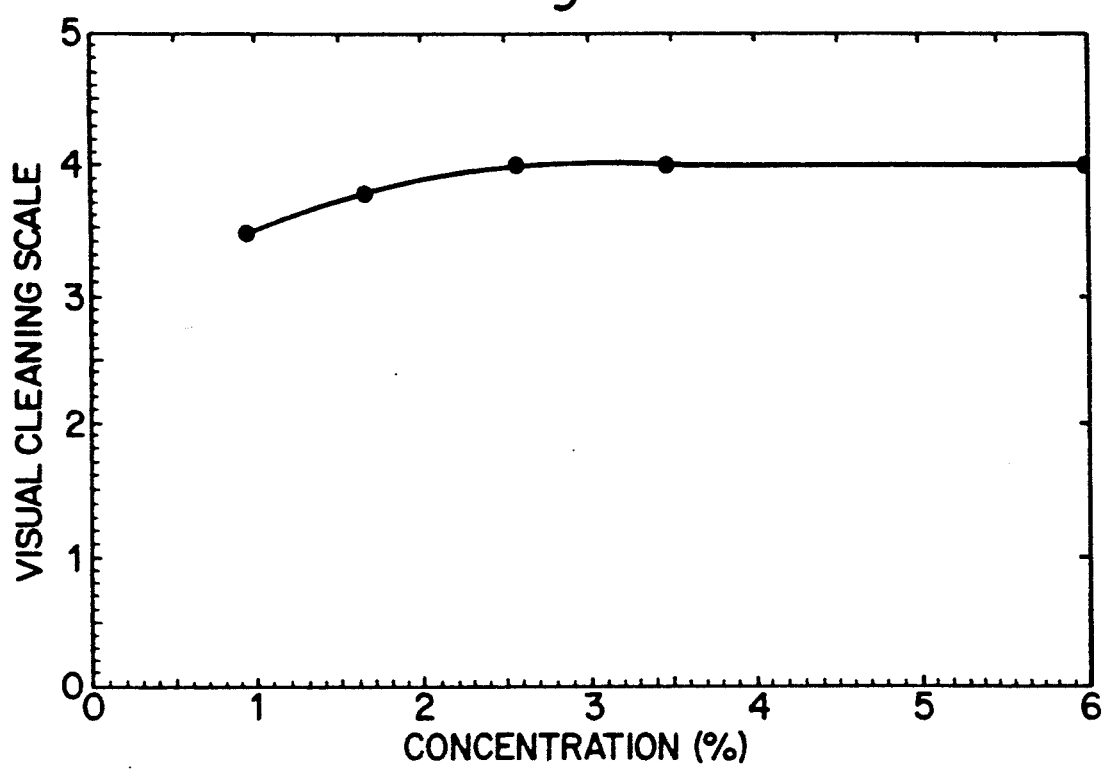
Figure 3:
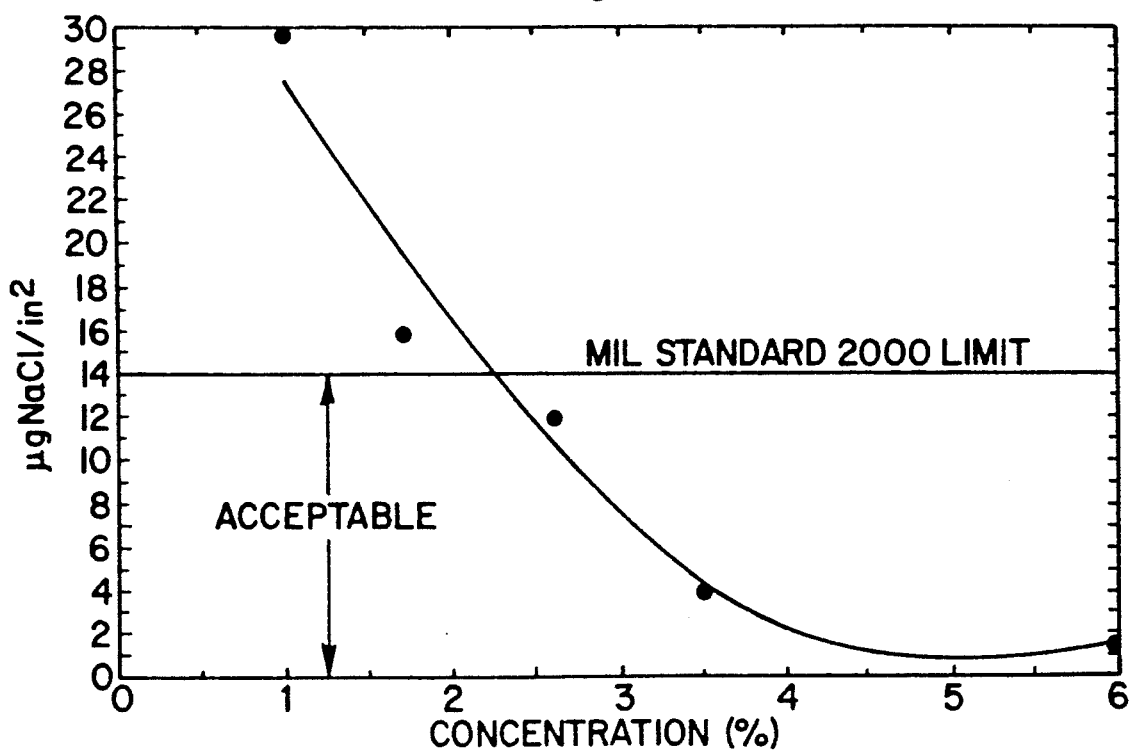
FIGS. 3, 5, and 7 represent typical curves showing the cleaning efficiencies of various concentrations of saponifier solutions resulting from equilibrium resistivity measurements as described herein.

Demonstration (H-40) circuit boards (circuit boards produced by Hollis Automation and which ware provided with drilled holes for the passage of leads therethrough) were immersed in flux and wave soldered with Kester 185 and evaluated both visually and on the Alpha 600 5MD Omega Meter for ionic contamination. FIGS. 2 and 3 illustrate the results of such evaluations. The visual evaluation in FIG. 2 again illustrates the effectiveness of the saponifier solutions of this invention. FIG. 3 confirms the visual results by extremely low ionic contamination results. FIG. 3 shows a concentration of about 2 percent results in an acceptable resistivity value of about 14 ug $NaCl/in^2$ according to MIL-P-28809A. The equilibrium resistivity measurements for the cleaning tests of Example II are also shown in Table I.

TABLE I
RESISTIVITY MEASUREMENTS OF CLEANED ROSIN FLUX SOLDERED PRINTED WIRING BOARDS

| Test Number | Saponifier Concentration (weight %) | Equivalent NaCl Contamination (ug/in$^2$) |
|---|---|---|
| 1 | 1.0 | 29.6 |
| 2 | 1.7 | 16.0 |
| 3 | 2.6 | 12.0 |
| 4 | 3.5 | 4.0 |
| 5 | 6.0 | 1.6 |

As shown in Table 1, the saponifier solutions examined were effective at concentrations below 2.0 percent in producing levels of residual board surface contamination that were far below the MIL-P-28809A requirement of 14 ug $NaCl/in^2$ equivalent. This is especially noteworthy in view of the configuration of the boards subjected to testing.

EXAMPLE III

Demonstration (H-50) circuit boards (produced by Hollis Automation and having fewer joints, etc. as the H-40 boards) were wave soldered with Kester 185.

Figure 4:
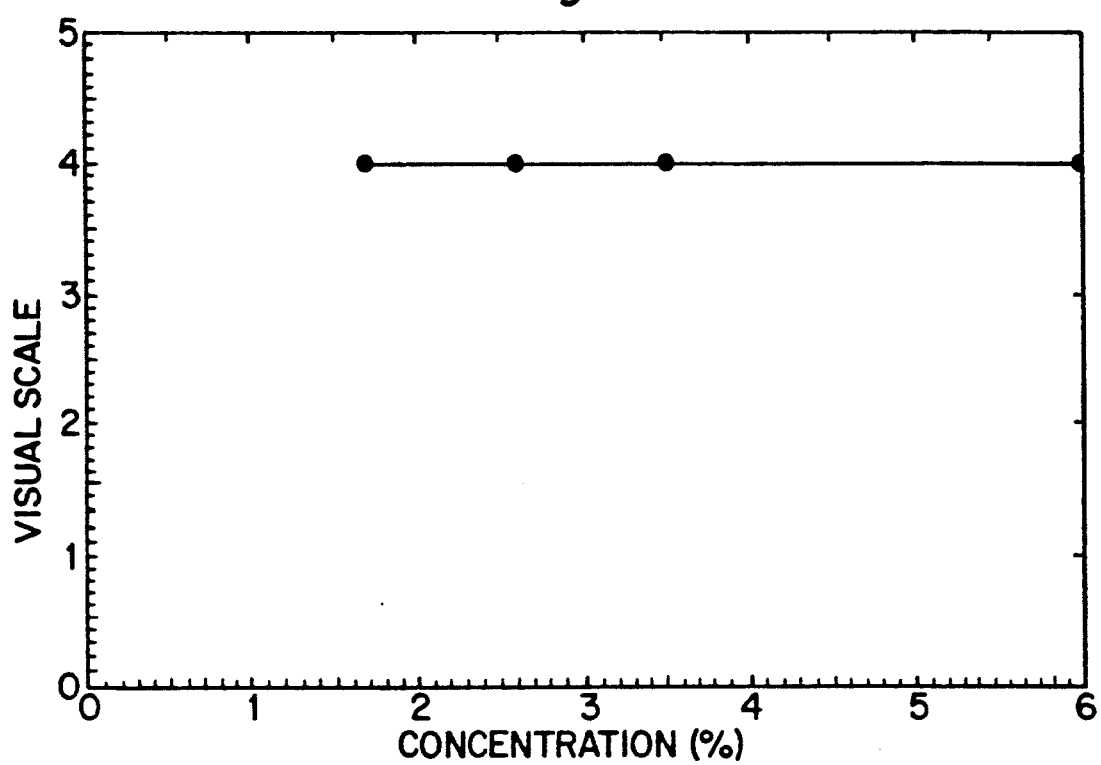
Figure 5:
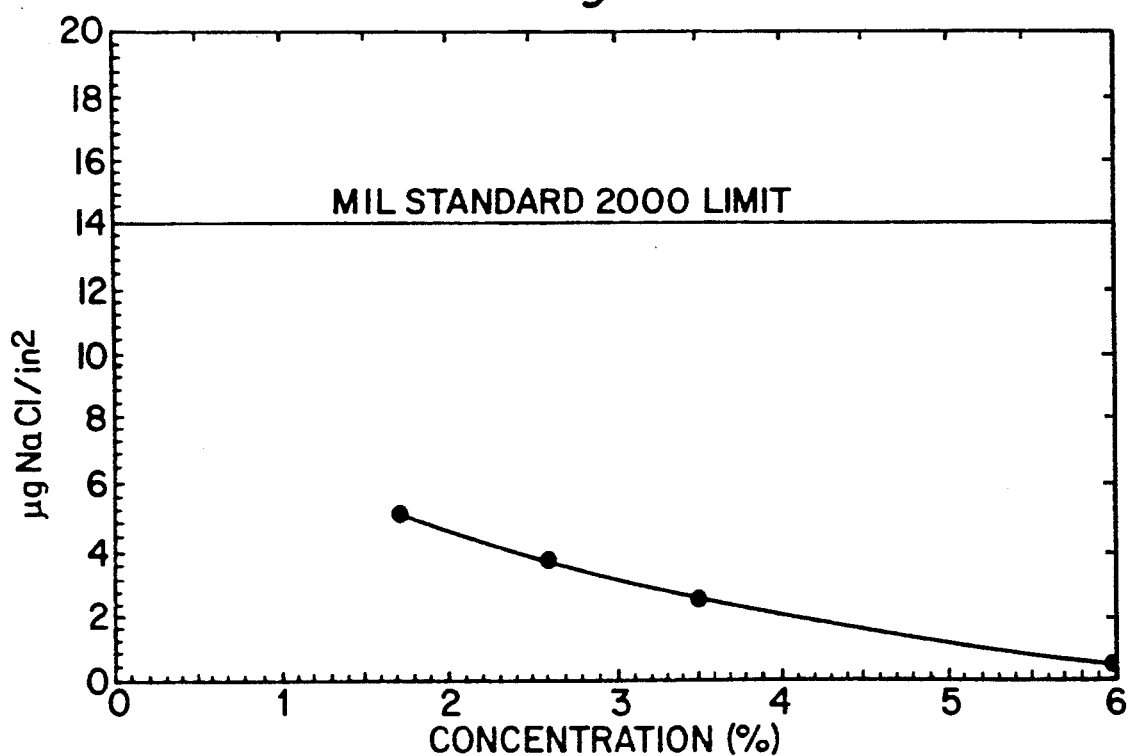

Both FIGS. 4 and 5 support the surprising effectiveness of the saponifier cleaning solutions of the present invention by both visual testing (FIG. 4) and by Omega Meter testing for ionic contamination (FIG. 5).

Table II also shows the equilibrium resistivity measurements for the cleaning tests of Example III.

TABLE II
RESISTIVITY MEASUREMENTS OF CLEANED ROSIN FLUX SOLDERED PRINTED WIRING BOARDS

| Test Number | Saponifier Concentration (weight %) | Equivalent NaCl Contamination (ug/in$^2$) |
|---|---|---|
| 1 | 1.7 | 5.0 |
| 2 | 2.6 | 3.6 |
| 3 | 3.5 | 2.4 |
| 4 | 6.0 | 0.8 |

As shown in Table II, the saponifier concentrations examined were all effective in producing levels of residual board surface contamination that were far below the MIL-P-28809A requirement of 14 ug $NaCl/in^2$ equivalent.

EXAMPLE IV

Figure 6:
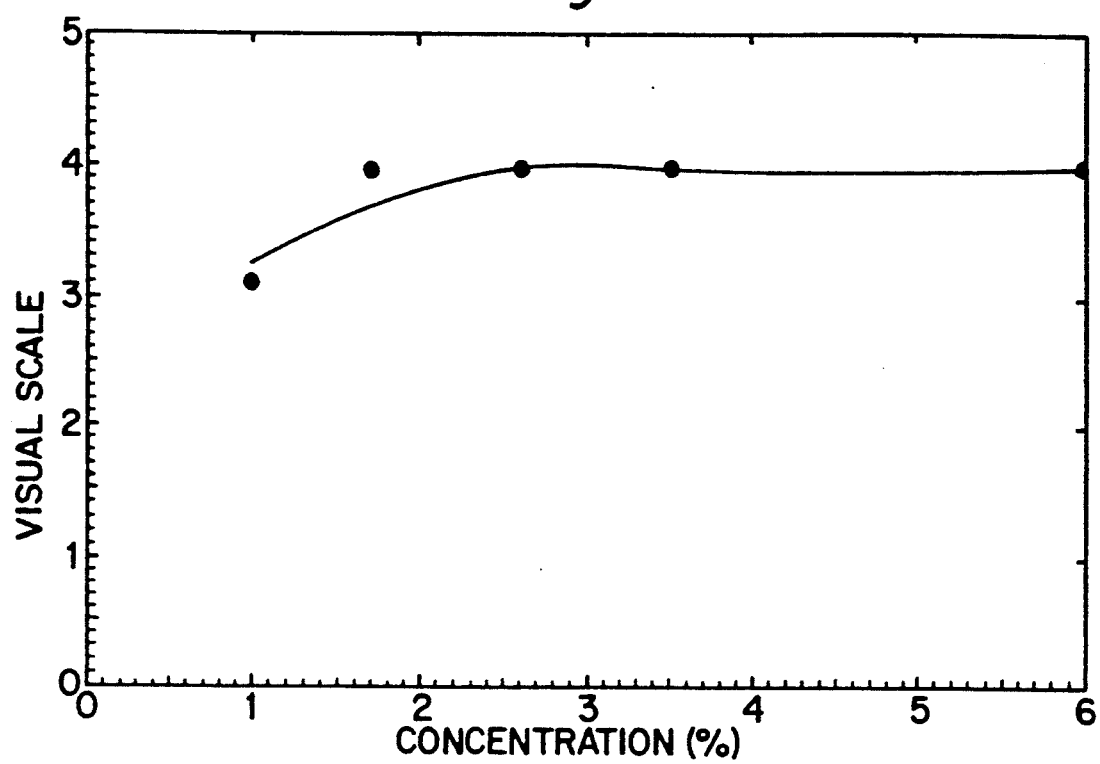
Figure 7:
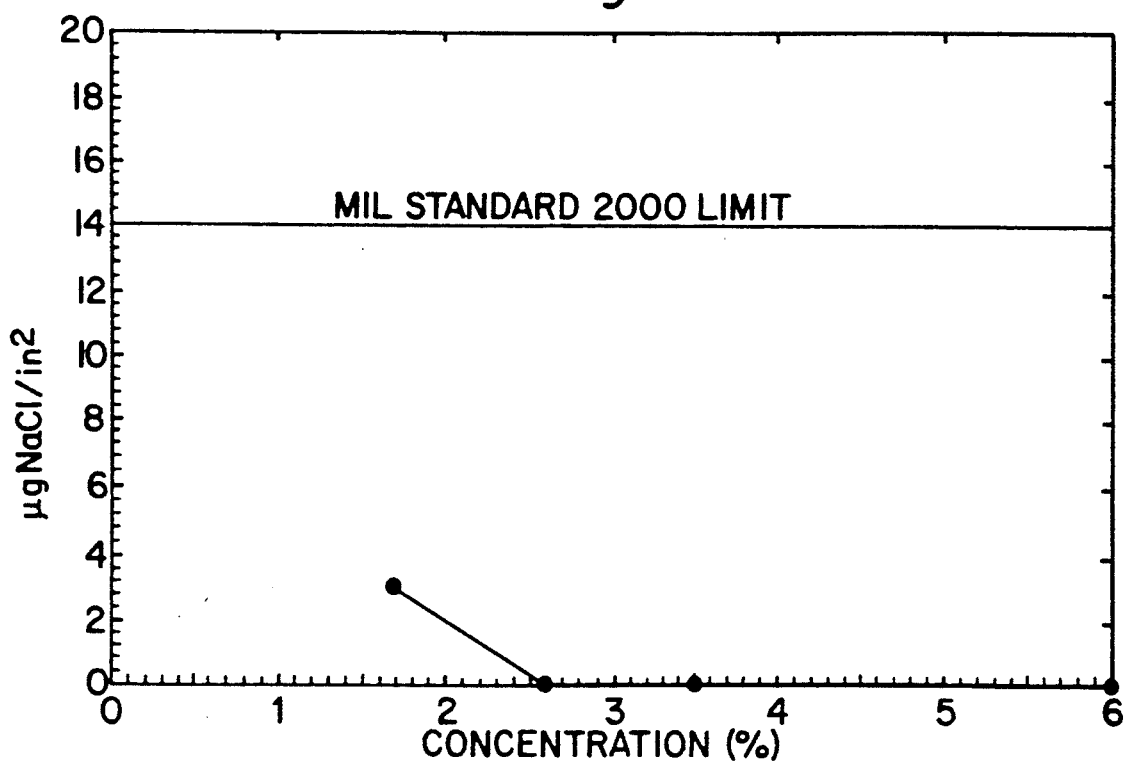

In this example, demonstration circuit boards similar to those of Example III were evaluated again both visually and for ionic contamination on the Omega Meter. These demo boards were reflowed with Kester R-229RMA paste. The results are shown in FIG. 6 which represents the results from visual testing and FIG. 7 which represents the ionic contamination results.

The equilibrium resistivity measurements for the cleaning tests effected in Example IV are also shown in Table III.

TABLE III
RESISTIVITY MEASUREMENTS OF CLEANED ROSIN FLUX SOLDERED PRINTED WIRING BOARDS

| Test Number | Saponifier Concentration (weight %) | Equivalent NaCl Contamination (ug/in$^2$) |
|---|---|---|
| 1 | 1.7 | 3.0 |
| 2 | 2.6 | 0 |
| 3 | 3.5 | 0 |
| 4 | 6.0 | 0 |

As shown in Table III, again, all the saponifier concentrations examined were effective in producing levels of residual board surface contamination that were far below the MIL-P-28809A requirement of 14 ug $NaCl/in^2$.

EXAMPLE V

For this Example separate tests were performed for effluent chemistry and aluminum abrasion in order to exemplify the environmental efficacy of the saponifiers of this invention. The effluent tests measured pH, BOD and COD. The methods employed are described in the following: (a) for chemical oxygen demand analysis see "Method for the Chemical Analysis of Water & Wastes, USEPA 600/4 79 020, Method 410.1 and (b) for biological oxygen demand analysis see "Method for the Chemical Analysis of Water & Wastes, USEPA 600/4 79 020, Method 405.1.

Two samples were drawn from the wash tank utilized in the previous Examples I–IV. Sample No. 1 was at a concentration of 2.6 percent by weight and Sample No. 2 was at a concentration of 3.5 percent by weight. No additional dilution was made, e.g., by mixing with the rinse water utilized. Each Sample was also measured for its pH. The results of these tests and measurements are presented in Table IV.

TABLE IV

|  | Sample Number | |
|---|---|---|
|  | 1 | 2 |
| Concentration (wt %) | 2.6 | 3.5 |
| BOD (ppm) | 35 | 33 |
| COD (ppm) | 71 | 71 |
| pH | 10.51 | 10.56 |

The results from the aluminum abrasion test showed no discoloration on the heat sinks. The evidences no corrosion or other chemical attack of aluminum surfaces.

The foregoing data clearly indicate the surprisingly low environmental impact accruing from the use of the saponifiers of this invention. The above BOD and COD values are markedly and, advantageously, lower than those required by various federal and/or state environmental agencies. These desirably lower values are also valuable in that costly containment equipment and the accompanying processing steps are either substantially reduced or rendered unnecessary.

EXAMPLE VI

This Example describes the methods utilized to attain the biological oxygen demand (BOD) and chemical oxygen demand (COD) values of representative concentrated saponifier solutions of this invention for comparative purposes with those of the prior art.

Accordingly, samples of a 26 percent saponifier concentrated solution of this invention containing, by weight, 75 percent potassium carbonate, 12.5 percent sodium bicarbonate and 12.5 percent sodium carbonate monohydrate and the remainder, i.e., 74 percent, water were prepared and tested according to the USEPA tests 600/4 79 020, methods 410.1 and 405.1 utilized in Example V.

The tests resulted in a BOD of less than 12 and a COD of less than 50. These value were reported as such since they were at the lowest threshold values reproduced by the tests.

These values compare favorably with prior art saponifiers, see for example, Hayes et al, U.S. Pat. Nos. 4,640,719 and 4,740,247 wherein BODs of about 295 and CODs of about 1,425 are reported.

EXAMPLE VII

This Example reports the pH values obtained from various concentrated saponifier solutions of the present invention.

In each test procedure the dry ingredients were initially dry mixed and then 35 percent by weight thereof was added to 65 percent by weight of deionized water.

The pH of three different concentrated saponifier solutions were as follows:

| Saponifier | pH |
|---|---|
| 1. 75 wt % potassium carbonate<br>12.5 wt % sodium bicarbonate<br>12.5 wt % sodium carbonate monohydrate | 11.15 |
| 2. 70 wt % potassium carbonate<br>30 wt % sodium bicarbonate | 10.80 |
| 3. 95 wt % potassium carbonate<br>5 wt % sodium bicarbonate | 11.97 |

Each of these saponifier concentrates exhibits a pH which is advantageously compatible with the electronic circuit boards being cleaned as well as the cleaning equipment presently utilized. Such solutions also are not environmentally detrimental and are easily processable and/or recoverable.

EXAMPLE VIII

The procedures of each of Examples I-IV are repeated except that 500 ppm of sodium bisulfite is added to the saponifier solutions as a reducing agent. The demo boards are cleaned consistent with the procedures of the Examples and then are examined as before. Visual testing and Omega Meter testing results are each comparable to the results of the previous tests. Visual examination indicates that the soldered joints remain shiny and are not dulled due to oxidation.

EXAMPLE IX

The procedure of Examples I-IV and VIII are repeated except that 500 ppm of hydrazine hydrate is added to the saponifier solutions as a reducing agent. After cleaning, the demo boards are examined as before. Visual and Omega Meter testing results are comparable to those of the previous tests. Visual examination also indicates that the soldered joints remain shiny. A further benefit accrues in that the hydrazine hydrate completely dissociates into water and leaves no film or residue.

EXAMPLE X

The procedures of each of Examples I-IV and VIII and IX are repeated except that 0.05 percent by weight of Pluronic L101 is added to saponifier solutions as an antifoam agent. Pluronic L101 is a poly(oxyethylene) poly(oxypropylene)-poly(oxyethylene) block copolymer having a molecular weight of about 3800 and is sold by BASF-Wyandotte. It is noted that any foam resulting from the saponification and agitation of the fluxes and other foam producing residues is reduced. Visual and Omega Meter testing results are comparable to those of the previous tests.

Many modifications and variations of this invention may be made without departing from its spirit and scope, as will become apparent to those skilled in the art. The specific embodiments described herein are offered by way of example only, and the invention is limited only by the terms of the appended claims.

We claim:

1. A saponifier composition for removing rosin soldering flux and other residues from electronic circuit assemblies and consisting essentially of substantially water soluble components, said substantially water soluble components comprising a mixture of alkali-metal carbonate and bicarbonate salts and about 6-10 wt. % based on the composition of a surfactant, said substantially water soluble components being free of a chelating agent and so combined that when in an aqueous saponifier solution of from about 1 to 1.7 percent by weight said solution has a pH of from about 10 to 12 and an adequate reserve of titratable alkalinity, at least equivalent to about 0.6 to 4.5 percent caustic potash when titrated to the colorless phenolphthalein end point.

2. The composition of claim 1 wherein said mixture of alkali-metal carbonate and bicarbonate salts comprise from about 70 to 95 percent by weight alkali metal carbonate salts, and from 5 to 30 percent by weight alkali metal bicarbonate salts, characterized by at least 50 percent by weight of said mixture comprising potassium carbonate.

3. The composition of claim 2 wherein said mixture comprises about 75 percent weight potassium carbonate, about 12.5 percent by weight sodium carbonate monohydrate and about 12.5 percent by weight sodium bicarbonate.

4. The composition of claim 1 wherein the saponifier composition is in an aqueous concentrated solution comprising from about 10 to 45 percent by weight of said saponifier composition and the remainder essentially water.

5. The composition of claim 4 wherein the saponifier composition contains an antifoam agent.

6. The composition of claim 1 wherein the saponifier composition is in a solution comprising from about 1 to 1.7 percent by weight of said saponifier composition and the remainder essentially water.

7. The composition of claim 6 wherein the saponifier solution contains up to about 0.1 percent by weight of an antifoam agent.

8. The composition of claim 6 wherein the saponifier solution has a biological oxygen demand (BOD) of less than 200 ppm and a chemical oxygen demand (COD) of less than 1000 ppm.

9. The composition of claim 4 wherein said water is deionized.

10. The composition of claim 6 wherein said water is deionized.

* * * * *